(12) United States Patent
Kudo et al.

(10) Patent No.: US 6,998,225 B2
(45) Date of Patent: Feb. 14, 2006

(54) METHOD OF PRODUCING COMPOUND SEMICONDUCTOR DEVICE

(75) Inventors: Akiyoshi Kudo, Tokyo (JP); Hiroshi Kobayashi, Kwasaki (JP); Takanori Matsumoto, Kawasaki (JP)

(73) Assignees: Mitsubishi Denki Kabushiki Kaisha, Tokyo (JP); EKC Technology Kabushiki Kaisha, Kawasaki (JP)

( * ) Notice: Subject to any disclaimer, the term of this patent is extended or adjusted under 35 U.S.C. 154(b) by 224 days.

(21) Appl. No.: 10/409,079

(22) Filed: Apr. 9, 2003

(65) Prior Publication Data

US 2003/0194656 A1    Oct. 16, 2003

(30) Foreign Application Priority Data

| Apr. 10, 2002 | (JP) | ............................ 2002-107915 |
| Feb. 21, 2003 | (JP) | ............................ 2003-044236 |

(51) Int. Cl.
   *G03F 7/00*   (2006.01)
   *G03F 7/42*   (2006.01)
(52) U.S. Cl. .................. 430/329; 430/311; 430/313; 430/331; 134/1.3; 510/176
(58) Field of Classification Search ............... 430/311, 430/313, 329, 331; 134/1.3; 510/176
   See application file for complete search history.

(56) References Cited

U.S. PATENT DOCUMENTS

| 4,567,132 | A | * | 1/1986 | Fredericks et al. ......... 430/312 |
| 5,395,739 | A | * | 3/1995 | Nakatani et al. ............ 430/311 |
| 5,548,144 | A | | 8/1996 | Kohno ....................... 257/284 |
| 5,880,483 | A | | 3/1999 | Shanfield et al. ............. 257/22 |
| 6,235,693 | B1 | | 5/2001 | Cheng et al. ................ 510/175 |
| 6,653,667 | B2 | * | 11/2003 | Kudo .......................... 257/192 |
| 2002/0000766 | A1 | * | 1/2002 | Ono et al. .................. 313/240 |

FOREIGN PATENT DOCUMENTS

| EP | 0 163 202 A2 | | 12/1985 |
| JP | 61-6827 | | 12/1985 |
| JP | 63-50837 | | 3/1988 |
| JP | 10-335352 | | 12/1998 |
| JP | 2000-47400 | | 2/2000 |
| JP | 2000-89480 | | 3/2000 |
| WO | WO 87/05314 | * | 9/1987 |
| WO | WO 90/00579 | * | 1/1990 |

OTHER PUBLICATIONS

S. Hara et al., "New Approaches on Controlling Schottky Barrier Heights", pp. 13-19.

(Continued)

*Primary Examiner*—Nicole Barreca
(74) *Attorney, Agent, or Firm*—Leydig, Voit & Mayer, Ltd.

(57) ABSTRACT

A method of producing a compound semiconductor device using a lift-off process. The lift-off process includes forming a resist mask having an electrode opening on an active layer of a compound semiconductor that is on a substrate of a compound semiconductor; forming a metal layer on the resist mask and the active layer in the electrode opening; and dissolving the resist mask and removing the metal layer on the resist mask, leaving the metal layer on the active layer in the electrode opening as an electrode. The resist mask is removed sufficiently by using a resist remover consisting essentially of at least one compound selected from an amine-including compound and nitrogen-including cyclic compounds so that the residual resist mask need not be removed by ashing.

12 Claims, 11 Drawing Sheets

OTHER PUBLICATIONS

Paul Miller et al., "Innovative Metal Lift-off Process Using Dry Carbon Dioxide", GaAs MANTECH, Inc., 2001.

Hideki Hasegawa, "Presents Status and Key Issues of Surface Passivation of III-V Compound Semiconductors", 2$^{nd}$ International Seminar on Semiconductor Surface Passivation, Sep. 10-13, 2001, Ustron, Poland, pp. 1-45.

Y. Kohno et al., "Modeling and Suppression of the Surface Trap Effect on Drain Current Frequency Dispersions in GaAs MESFETs", IEEE 1994, pp. 263-266.

K. Horio et al., "Analysis of Surface-Related Deep-Trap Effects on Gate-Lag Phenomena in GaAs MESFETs", IEEE 1996, pp. 175-178.

"Compound Semiconductor Surface Passivation and Novel Device Processing", Apr. 5-7, 1999, vol. 573 of the Materials Research Society Symposium Proceedings Series.

Xiaizhong Dang et al., "Long Time-Constant Trap Effects in Nitride Heterostructure Field Effect Transistors", Mat. Res. Soc. Symp., vol. 622, 2000 Materials Research Society, pp. T6.28.1-T6.28.6.

* cited by examiner

FIG. 7 HKX-802 85°C 30min

METHOD OF PRODUCING COMPOUND SEMICONDUCTOR DEVICE

CROSS-REFERENCE TO RELATED APPLICATIONS

Related patent applications are commonly assigned Japanese Patent Applications No. 2003-44236 filed on Feb. 21, 2003, and No. 2002-107915 filed on Apr. 10, 2002, which are incorporated by reference into the present patent application.

BACKGROUND OF THE INVENTION

1. Field of the Invention

The present invention relates to a method of manufacturing a compound semiconductor device, that is particularly useful for a method to avoid oxidation steps in removal of resists and cleaning the surface of the compound semiconductor device.

2. Description of the Related Art

In manufacturing a GaAs field effect transistor (GaAs FET), after forming source and drain electrodes and a recess in an active layer of GaAs, a gate metal is deposited on a photoresist mask. The photoresist mask has an opening at a central portion of the recess. Excess metal on the photoresist mask and the mask are lifted off to create a gate electrode. Then, a passivation film is deposited, completing manufacture of a GaAs field effect transistor. When the lift-off method is used, it is necessary that the residues of the photoresist be completely eliminated by ashing with an oxygen plasma or photo ozone after lifting-off the resist and excess metal. Further, in GaAs field effect transistors, trapping and releasing of electrons attributed to the surface (interface) states of GaAs crystal gives rise to a gate lag phenomenon of the transistor. Noting this, various methods such as a surface modification treatment or a plasmaless passivation have been tried to avoid influences of the surface (interface) states at the recess in the surface of the GaAs crystal (Hideaki Ikoma: Applied Physics 69, PP. 159–165 (2000)).

Contrary-to the conventional ideas, the inventor found that the gate lag is not caused by the trapping and releasing of electrons at/to the surface state as considered formerly, but is mainly due to the GaAs oxides existing on the GaAs surface.

The inventor has also found that the GaAs oxides deteriorates various characteristics of GaAs devices such as a gate/drain breakdown voltage, a FET noise or the like. Thus excellent GaAs semiconductor devices with no gate lag were developed. The novel idea was named "Asherless, i.e., a method without excess GaAs oxides".

Further, the inventor found that resist removers containing N-methyl-2-pyrrolidone (NMP) as a component make it possible to effectively remove residues of photoresists and organic chemicals to such an extent as to omit the ashing step from the lift-off process.

However, as GaAs integrated circuits contain more field effect transistors, removal of photoresists and organic chemicals becomes more difficult and complex. Some of the residues deteriorate the entire GaAs integrated circuit and reduce the production yield of a wafer. It is recognized that the demands for improved performance of residual resist removal with avoidance of attack on GaAs field effect transistors.

SUMMARY OF THE INVENTION

The present invention aims to provide an asherless method of producing a compound semiconductor device that avoids oxidation steps in removal of resists and in cleaning the surface, and it is useful for manufacturing an advanced compound semiconductor integrated circuit.

The present invention provides a lift-off method to produce a compound semiconductor device. The lift-off process includes a step of forming a resist mask having an electrode opening on an active layer of a compound semiconductor formed on a substrate of a compound semiconductor; a step of forming a metal layer on the resist mask and the active layer in the electrode opening; and a releasing step of dissolving the resist mask and removing the metal layer formed on the resist mask to leave the metal layer on the active layer in the electrode opening as an electrode. In the lift-off step, a resist remover composed of one or more compounds selected from a group consisted of amines and/or cyclic compounds containing nitrogen is used to such an extent as to omit the ashing from the lift-off step.

In this producing method, the resist mask can be released by using a resist remover essentially consisting of one or more compounds selected from a group consisting of amines and/or compounds containing nitrogen, without leaving any residual resist. This eliminates the need of an ashing process using oxygen plasma or the like, which has conventionally been performed to remove residual resist (asherless process). This asherless process can prevent deterioration of various characteristics of the device resulting from the oxide layer formed on the surface of the semiconductor material formed by the ashing process, such as gate lag, changes in the gate/drain breakdown voltage, and deterioration of the noise characteristics.

Further, deterioration of recess current characteristics caused by the use of an aggressive resist remover can be prevented.

DETAILED DESCRIPTION OF THE PREFERRED EMBODIMENTS

First Preferred Embodiment

FIGS. 1A–1D are sectional views showing processes of manufacturing a GaAs field effect transistor 100 according to this embodiment. The producing method includes the following Steps 1 though 4.

Figure 1A:
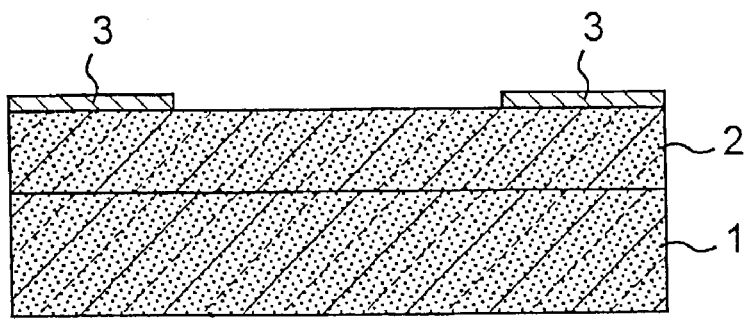
FIGS. 1A–1D are sectional views showing a process of producing a GaAs field effect transistor according to a first preferred embodiment of the present invention.

Step 1: As shown in FIG. 1A, source/drain electrodes 3 composed of an alloy of Au/Ge and Ni or the like, are formed on an active layer 2.

Figure 1B:
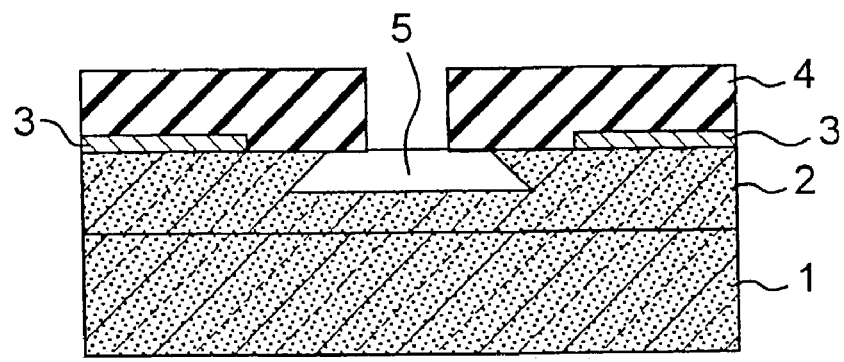

Step 2: After, forming the resist mask 4 made of novolac resin or the like, the active layer 2 is wet-etched to form recess 5 as shown in FIG. 1B.

Figure 1C:
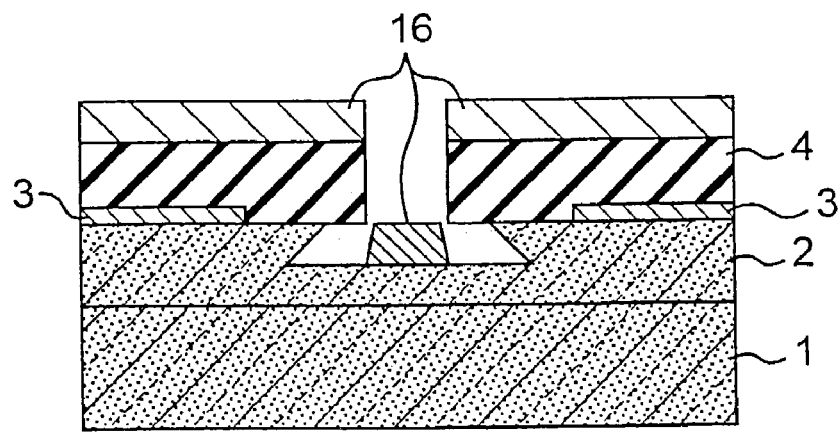

Step 3: Metal layer 16 composed of a stack of Ti/Al/Mo (from bottom to top) or the like is deposited on each surface of the recess 5 and resist mask 4 as shown in FIG. 1C.

Figure 1D:
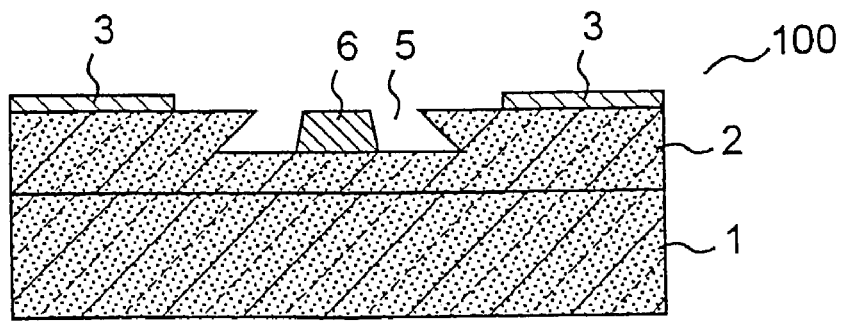

Step 4: Then, the resist mask 4 and metal layer 16 are lifted-off to create the gate electrode 6 so as to be placed on the active layer 2 at the central portion of the recess 5 as shown in FIG. 1D. This releasing step is performed by immersing a semi-insulating substrate 1 having a resist mask formed thereon in a resist remover at a temperature and time of about 85 degree C. and about 30 minutes.

The compositions of the resist remover of this invention are amines and/or cyclic compounds containing nitrogen. They comprise from about 10 to 50 percent of 3-methyl-2-oxazolidinone (MOZ) by weight, and the rest is N-methyl-2-pyrrolidone (NMP). Preferably, the compositions are about 10 percent of MOZ by weight and about 90 percent of NMP by weight. Since NMP possesses strong polarity of its molecule, it exhibits high performance in dissolving organic chemicals without causing dissolution or corrosion of the GaAs active layer 2 and the source/drain electrodes 3 and gate electrode 6 consisted of metals.

Since MOZ possesses strong polarity of its molecule, it also exhibits high performance in dissolving organic chemicals without causing dissolution or corrosion of the GaAs active layer 2 and the source/drain electrodes 3 and gate electrode 6 consisted of metals.

The compositions of the resist remover used in the producing method of this embodiment are at a predetermined ratio effective for resist removal. Due to the difference in chemical and physical properties between NMP and MOZ, combination of the compounds at ratio adequate to removal of the mask 4 is synergistically effective in lift-off process without causing corrosion or dissolution of GaAs crystal and metals.

This eliminates the need of an ashing process using oxygen plasma or photo ozone for removing residual resist or organic substances adhering to the surface of the active layer 2 after removal of the resist mask 4. (Such a process including no ashing process is hereinafter referred to as an "asherless process".)

Examples of cyclic compounds containing nitrogen, such as dimethyl piperidone, 5-methyl-2-pyrrolidone, 5-methyl-2-pyrrolidinone, N-ethyl-2-pyrrolidone, N-hydroxylethyl-2-pyrrolidone, N-cyclohexyl-2-pyrrolidone, and N-methyl-$\epsilon$-caprolactam, N-ethyl-$\epsilon$-caprolactam, are available in place of MOZ.

After a releasing step in which the resist mask 4 is immersed in the resist remover, the semi-insulating GaAs substrate 1 is immersed in isopropyl alcohol (IPA) and rinsed therein.

Amines and/or compounds containing nitrogen need to be rinsed with isopropanol in order to avoid forming acidic species. If acidic species are generated by mixing resist removers with the cleaning solutions, an adverse problem frequently occurs: the resultant acids corrode the boundaries of the grains in the source/drain electrodes 3 to bring about decreases in recess current.

Accordingly, usage of IPA as a cleaning solution prevents deterioration of the recess current characteristics.

Alcohols such as n-propyl alcohol, ethyl alcohol and methyl alcohol are also available as cleaning solutions. Isopropanol is commercially most preferable.

In these steps described above, the GaAs field effect transistor 100 as shown in FIG. 1D is completed.

Figure 2:
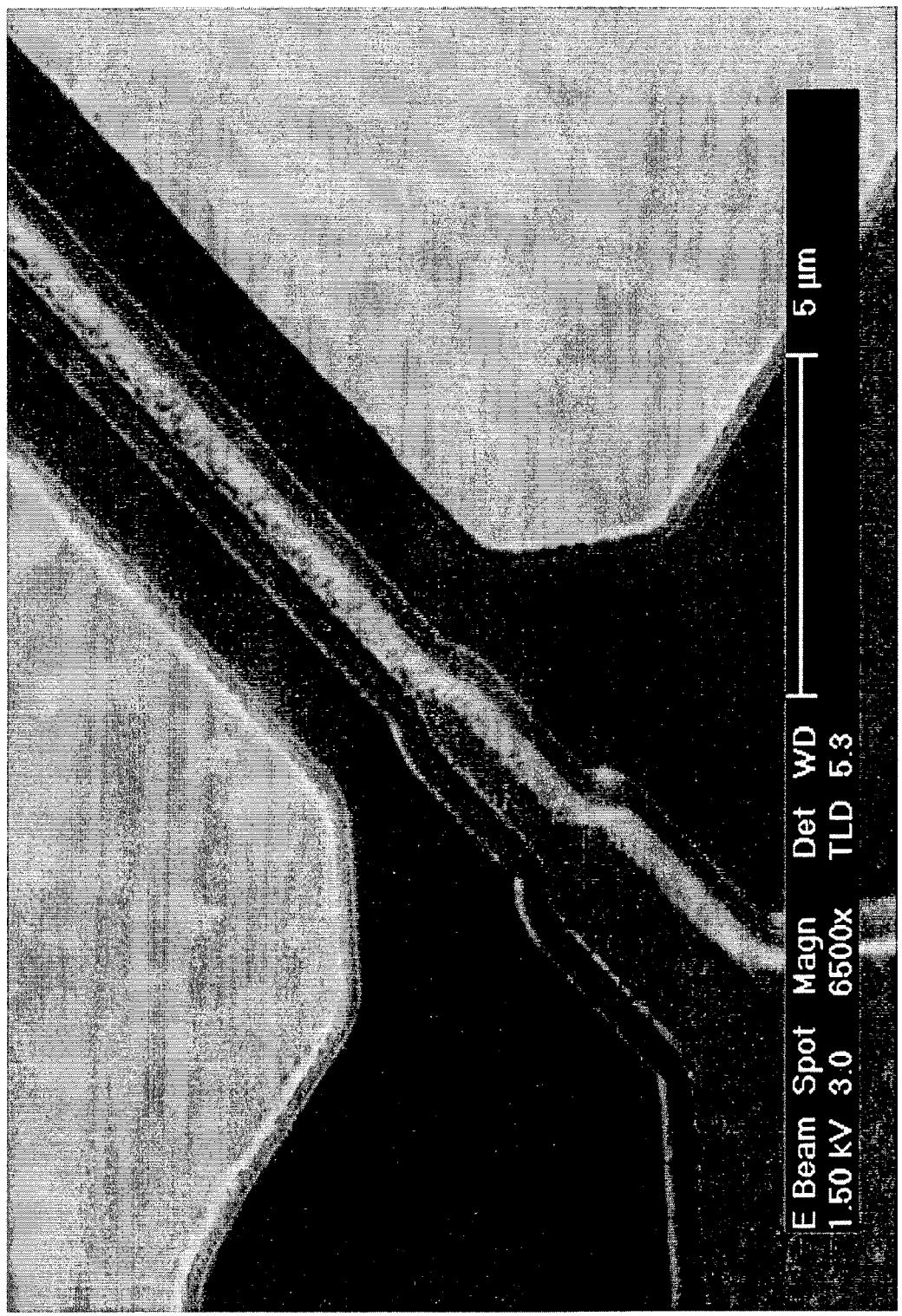
FIG. 2 is a SEM image showing a surface of the GaAs field effect transistor produced by the method according to the-first preferred embodiment of the present invention.

FIG. 2 is a SEM image showing the surface of the GaAs field effect transistor 100 produced by the asherless process. The image shows a gate electrode and source/drain electrodes formed on both sides thereof. In the SEM image, the gate electrode formed in a recess extends from the left bottom to the right top. The source/drain electrodes are disposed at the both sides of the gate electrode as shown at the top of the SEM image.

Figure 3:
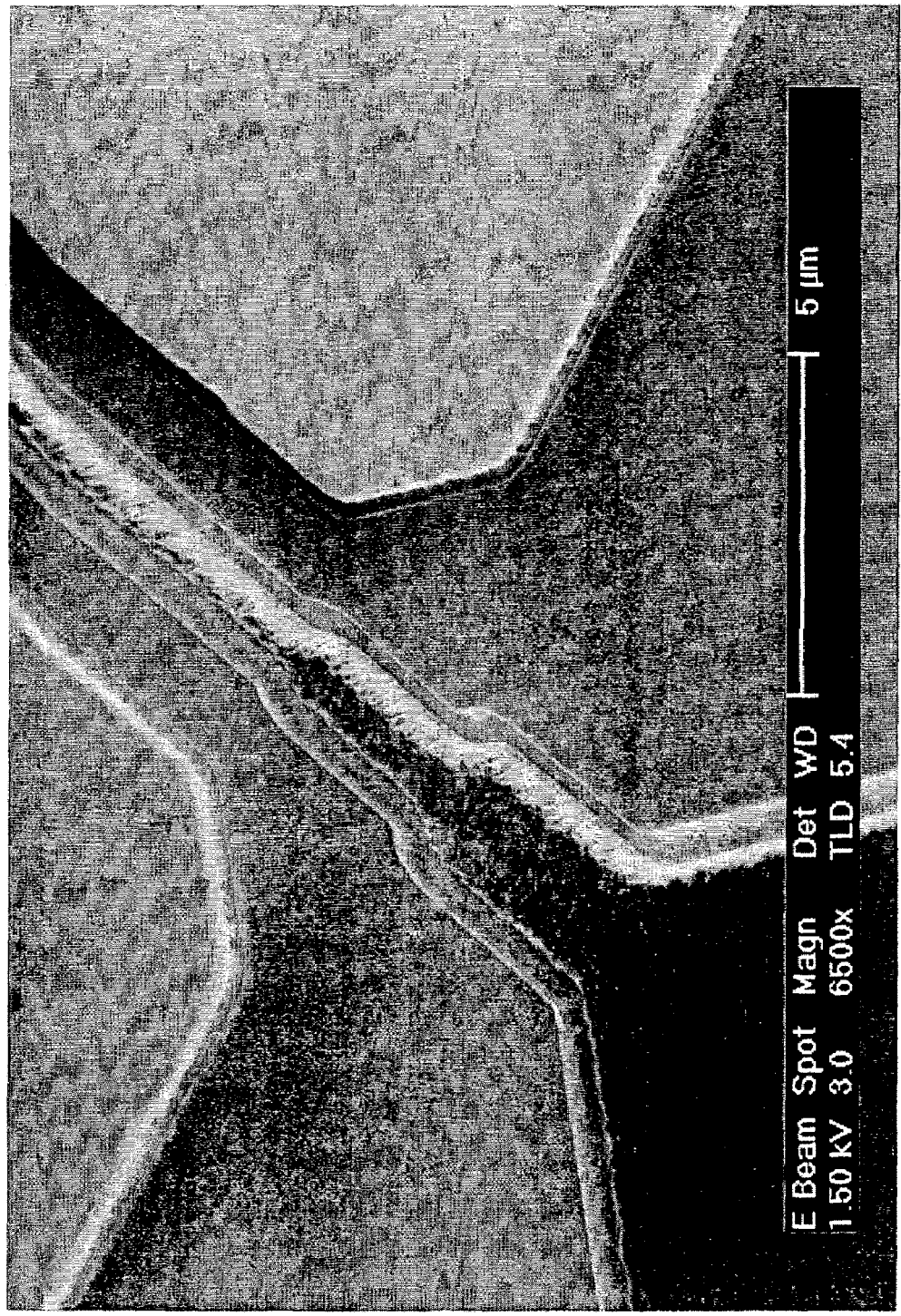
FIG. 3 is a SEM image showing a surface of a GaAs field effect transistor produced by a conventional method.

FIG. 3 shows a SEM image of a surface of GaAs FET 100 produced by the conventional resist remover containing NMP. Except for the resist remover in lift-off, the process of manufacturing the GaAs field effect transistor is the same as the above-mentioned method on the manufacturing of FIG. 100.

In the center of the SEM image of FIG. 3, residues made of organic chemicals photographed as some particles are seen to exist on the GaAs surface in the vicinity of the gate electrode.

Figure 4:
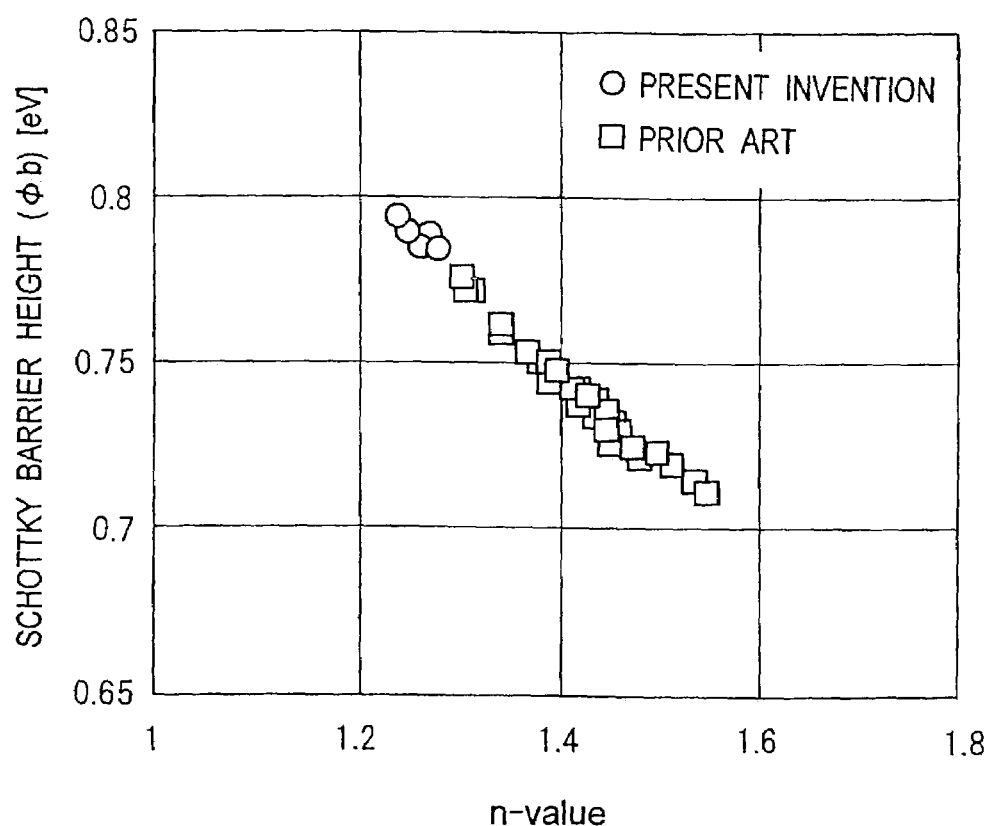
FIG. 4 is a graph plotting the ideality factor (n-value) and the Schottky barrier height ($\phi$b).

FIG. 4 shows the variation of the Schottky gate performance of GaAs FETs 100, with PE-CVD SiNx dielectric film deposited as passivation, produced by the asherless method using the resist remover of this embodiment and using a conventional remover. In the figure, the abscissa axis of n-value denotes the ideality factor and the ordinate of $\phi b$ denotes the Schottky barrier height. The Schottky gate performances of the present invention are marked with circles, and the prior art with squares.

In comparison with the conventional GaAs field effect transistor in which the lift-off process for leaving the gate is performed by using the conventional resist remover containing N-methyl-2-pyrrolidone, the GaAs field effect transistor 100 of this embodiment has higher Schottky barrier, and has an ideality factor closer to the value of 1. As can be seen from FIG. 4, variations in characteristics among devices are improved and reduced.

Since the resist remover of this embodiment is able to strip the residual organic chemicals effectively without changing the state of native oxides (i.e., surface state) on the GaAs crystal in the lift-off process, Schottky gate characteristics is enhanced and device performances such as a FET noise are improved For the GaAs field effect transistor 100 of this embodiment, the thickness of the GaAs oxides existed on the active layer is from about 4 Å to about 6 Å, and preferably about 5 Å.

Next, characteristics of recess current is evaluated before/after the lift-off process. An aggressive resist remover containing ortho-dichlorobenzen and phenol, that is highly effective for resist removal, is used to compare this embodiment with a conventional remover. The comparative experiments are performed by using the process of manufacturing the GaAs FET 100.

Figure 5A:
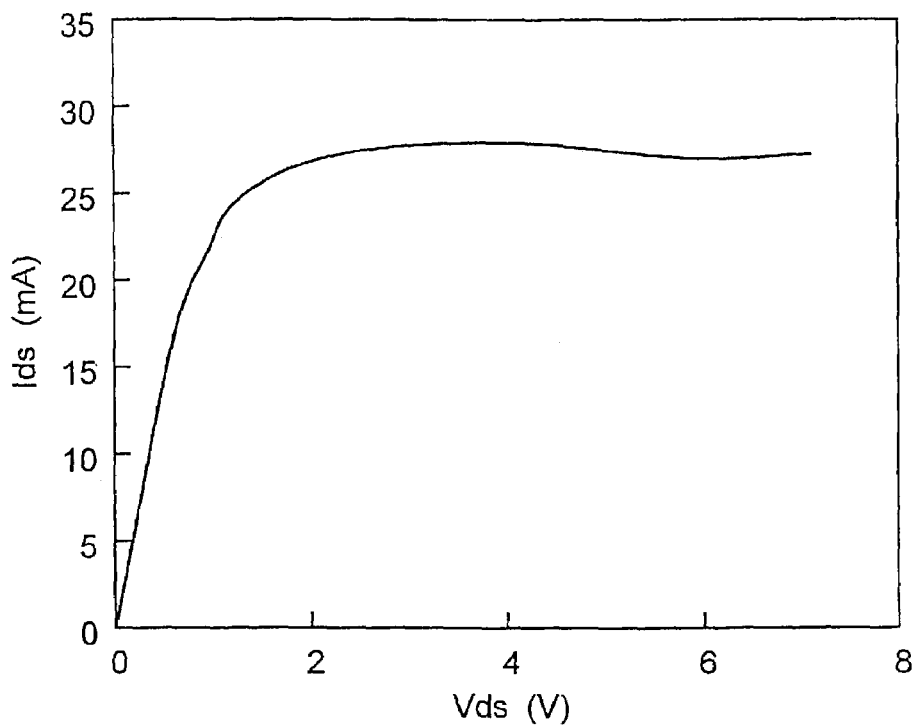
FIGS. 5A and 5B are graphs showing recess current characteristics of the gateless GaAs field effect transistor before (A) and after (B) a lift-off process using the conventional resist remover.
Figure 5B:
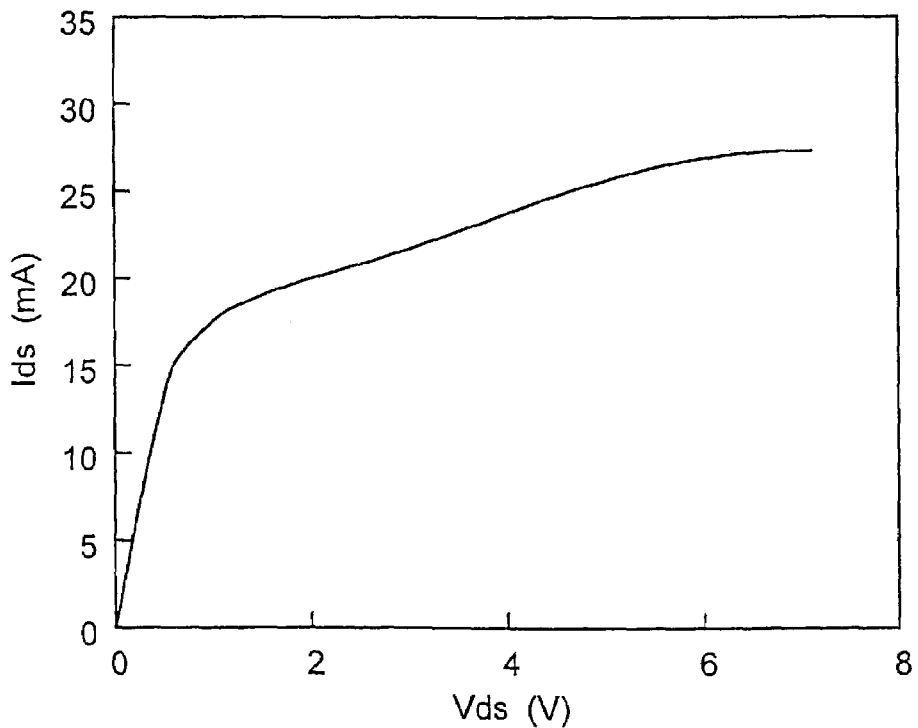

FIGS. 5A and 5B show changes in the recess current characteristics when the lift-off process is performed using a conventional resist remover including ortho-dichlorobenzene and phenol as components thereof. FIGS. 5A and 5B show before/after characteristics of recess current in the lift-off process. In the FIGS. 5A and 5B, the abscissa axis denotes voltage (Vds) applied across the source and drain, and the ordinate axis denotes current (Ids) flowing through the active GaAs. In order to evaluate the changes in recess current caused by the resist removers, gateless GaAs FETs (under the condition where the gate metal denoted by reference number 16 in FIG. 1 is not deposited) are experimented. This condition also applies to FIGS. 6, 8, 10 and 11.

The lift-off process is performed by immersing the semi-insulating GaAs substrate 1 into the resist remover at a temperature and time of about 80 degree C. and 30 minutes. Other producing steps are the same as the Steps 1 through 4, namely an asherless process is used.

As shown in before/after comparisons of the figures of the conventional method, the current Ids decreases when the voltage Vds ranges from 1V to 6V. This resist remover has aggressive ability to remove resist and thus no residual resist remains.

Figure 6:
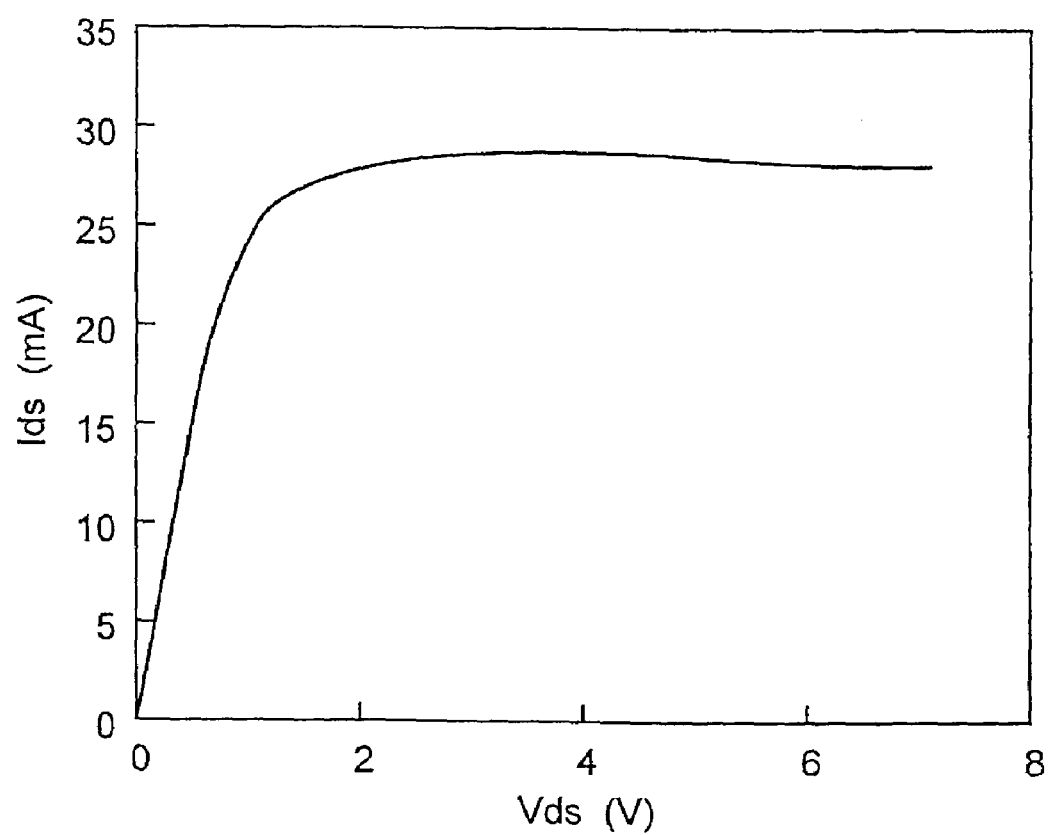
FIG. 6 is a graph showing recess current characteristics of the gateless GaAs field effect transistor produced by the method according to the first preferred embodiment of the present invention.

FIG. 6 demonstrates recess current characteristics of a gateless GaAs FET after the lift-off process using the resist remover of this embodiment. Compared to the FIGS. 5A and 5B, before/after recess current characteristics in Vds-Ids relation is seen to be steady in the process of this embodiment. Namely, the removing composition of this embodiment containing MOZ and NMP at a ratio and temperature and time adequate to removal of residual resists is able to prevent deterioration of recess current characteristics in the lift-off process.

Further, it is confirmed that the recess current characteristics do not deteriorate even when the semi-insulating GaAs substrate 1 is immersed in the resist remover for about 4 hours, for example. Thus, even with the semi-insulating substrate 1 having a larger area and thus requiring a longer period of releasing step, use of this resist remover allows an asherless releasing step without deterioration of the recess current characteristics.

As described above, in the releasing step of this embodiment, the use of a resist remover consisting of 3-methyl-2-oxazolidinone and N-methyl-2-pyrrolidone as the resist remover allows removal of a resist mask without leaving residual resist or organic substances.

This eliminates the need of an ashing process using oxygen plasma or the like for removing residual resist (asherless process), and prevents deterioration of various characteristics of the device caused by formation of GaAs oxides in the ashing process, such as gate lag, changes in the gate/drain breakdown voltage, and deterioration of the FET noise.

Further, deterioration of the recess current characteristics caused by the use of an aggressive resist remover can be prevented.

Second Preferred Embodiment

The method of producing the GaAs field effect transistor 100 of this embodiment is the same as that of the first preferred embodiment except for the resist remover used in Step 4.

In the producing method of this embodiment, after the resist mask is formed in the Steps 1 through 3, the resist mask is released using a resist remover consisting of a mixture of morpholine and N-methyl-2-pyrrolidone, cyclic compounds containing nitrogen.

As for the mixing ratio of the resist remover, the mixture includes about 10 percent to about 50 percent of morpholine by weight and the rest of the mixture consists of N-methyl-2-pyrrolidone (NMP). Preferably, the mixture consists of about 10 percent of morpholine by weight and about 90 percent of N-methyl-2-pyrrolidone by weight.

This releasing step is performed by immersing the semi-insulating GaAs substrate 1 having the resist mask formed thereon into the resist remover at a temperature and time of about 85 degree C. and about 30 minutes.

The resist remover used in the producing method of this embodiment allows effective removal of the resist mask and residual resist without causing corrosion or dissolution of GaAs or metals.

This eliminates the need of an ashing process for removing residual resist after the removal of the resist mask (asherless process).

After the resist mask is immersed in the resist remover and released, the semi-insulating substrate 1 is immersed in isopropyl alcohol (IPA) and rinsed therein. Using isopropyl alcohol as the cleaning solution can prevent deterioration of the recess current characteristics of the device caused by another cleaning solution including the resist remover dissolved therein.

In these steps, the GaAs field effect transistor 100 as shown in FIG. 1D is completed.

Figure 7:
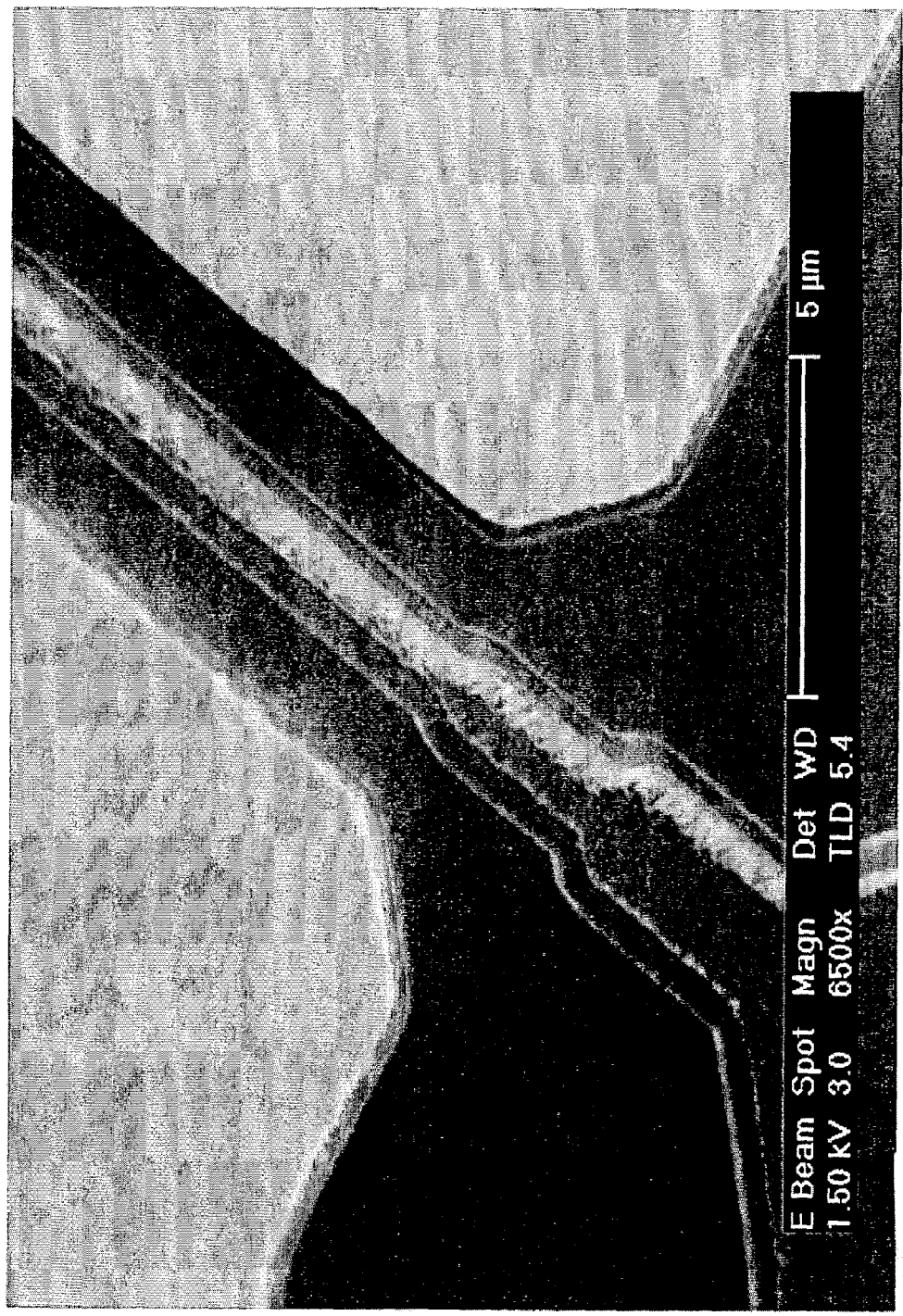
FIG. 7 is a SEM image showing a surface of a GaAs field effect transistor produced by a method according to a second preferred embodiment of the present invention.

FIG. 7 is a SEM image showing the surface of the GaAs field effect transistor 100 produced by the asherless process. Similar to FIG. 2, the image shows a gate electrode and source/drain electrodes formed on both sides thereof.

As shown in the SEM image, the transistor has an excellent appearance having no residual resist.

Figure 8:
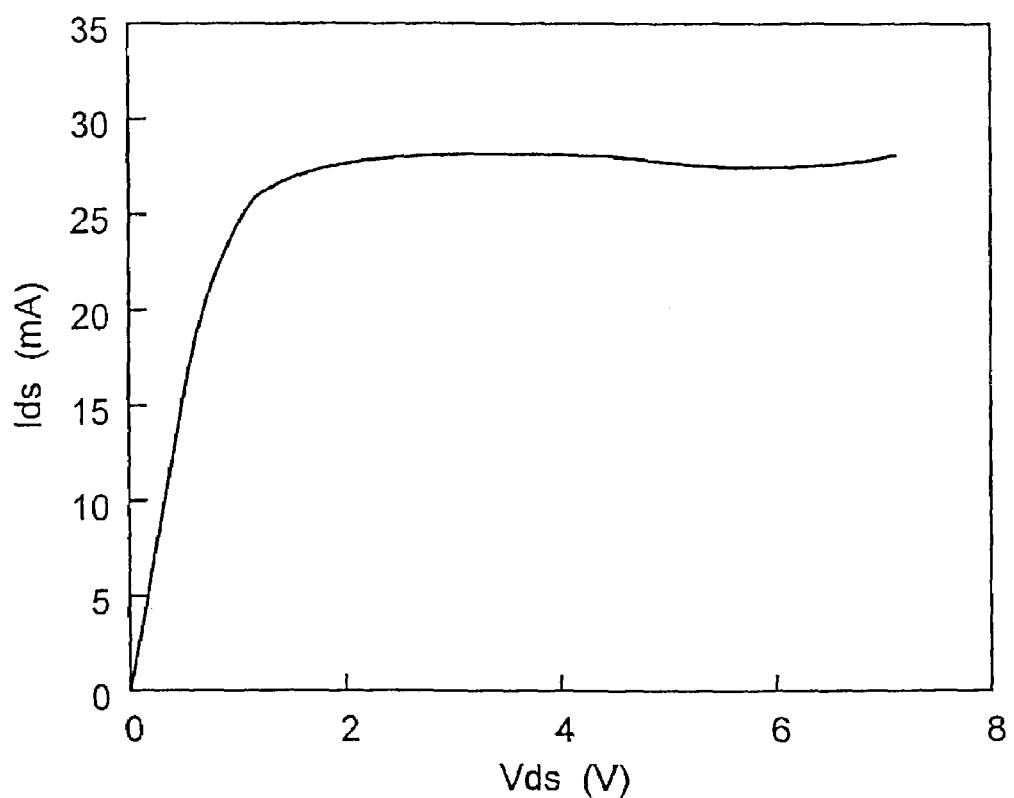
FIG. 8 is a graph showing recess current characteristics of the gateless GaAs field effect transistor produced by the method according to the second preferred embodiment of the present invention.

FIG. 8 is a graph showing the relation between Vds and Ids, i.e. recess current characteristics, after the lift-off process using the resist remover of this embodiment, under the condition of no gate electrode. As can be seen from FIG. 8, characteristics substantially identical with the recess current characteristics before the lift-off process shown in FIG. 5A are obtained.

As described above, for the producing method of this embodiment, the use of the resist remover consisting of morpholine and N-methyl-2-pyrrolidone allows removal of a resist mask without leaving any residual resist, and accomplishment of an asherless process. This can prevent deterioration of various characteristics of the device caused in the ashing process, such as gate lag, changes in the gate/drain breakdown voltage, and deterioration of the FET noise. Further, variations in the recess current characteristics caused by the use of an aggressive resist remover can be prevented.

Third Preferred Embodiment

The method of producing the GaAs field effect transistor 100 of this embodiment is the same as that of the first preferred embodiment except for the resist remover used in Step 4.

In the producing method of this embodiment, after the resist mask is formed in the Steps 1 through 3, the resist mask is released using a resist remover of a mixture consisting of dimethyl piperidone (DMPD) and N-methyl-2-pyrrolidone (NMP).

As for the mixing ratio of the resist remover, the mixture includes about 10 percent to about 50 percent of dimethyl piperidone by weight and the rest of the mixture consists of N-methyl-2-pyrrolidone. Preferably, the mixture consists of about 10 percent of dimethyl piperidone by weight and about 90 percent of N-methyl-2-pyrrolidone by weight.

This releasing step is performed by immersing the semi-insulating GaAs substrate 1 having the resist mask formed thereon into the resist remover at a temperature and time of about 85 degree C. and about 30 minutes.

The resist remover used in the producing method of this embodiment allows effective removal of the resist mask and residual resist without causing corrosion or dissolution of GaAs or metals.

This eliminates the need of an ashing process for removing residual resist after the removal of the resist mask (asherless process).

After the resist mask is immersed in the resist remover and released, the semi-insulating substrate 1 is immersed in isopropyl alcohol (IPA) and rinsed therein. Using isopropyl alcohol as the cleaning solution can prevent deterioration of the characteristics of the device caused by another cleaning solution including the resist remover dissolved therein.

In these steps, the GaAs field effect transistor 100 as shown in FIG. 1D is completed.

Figure 9:
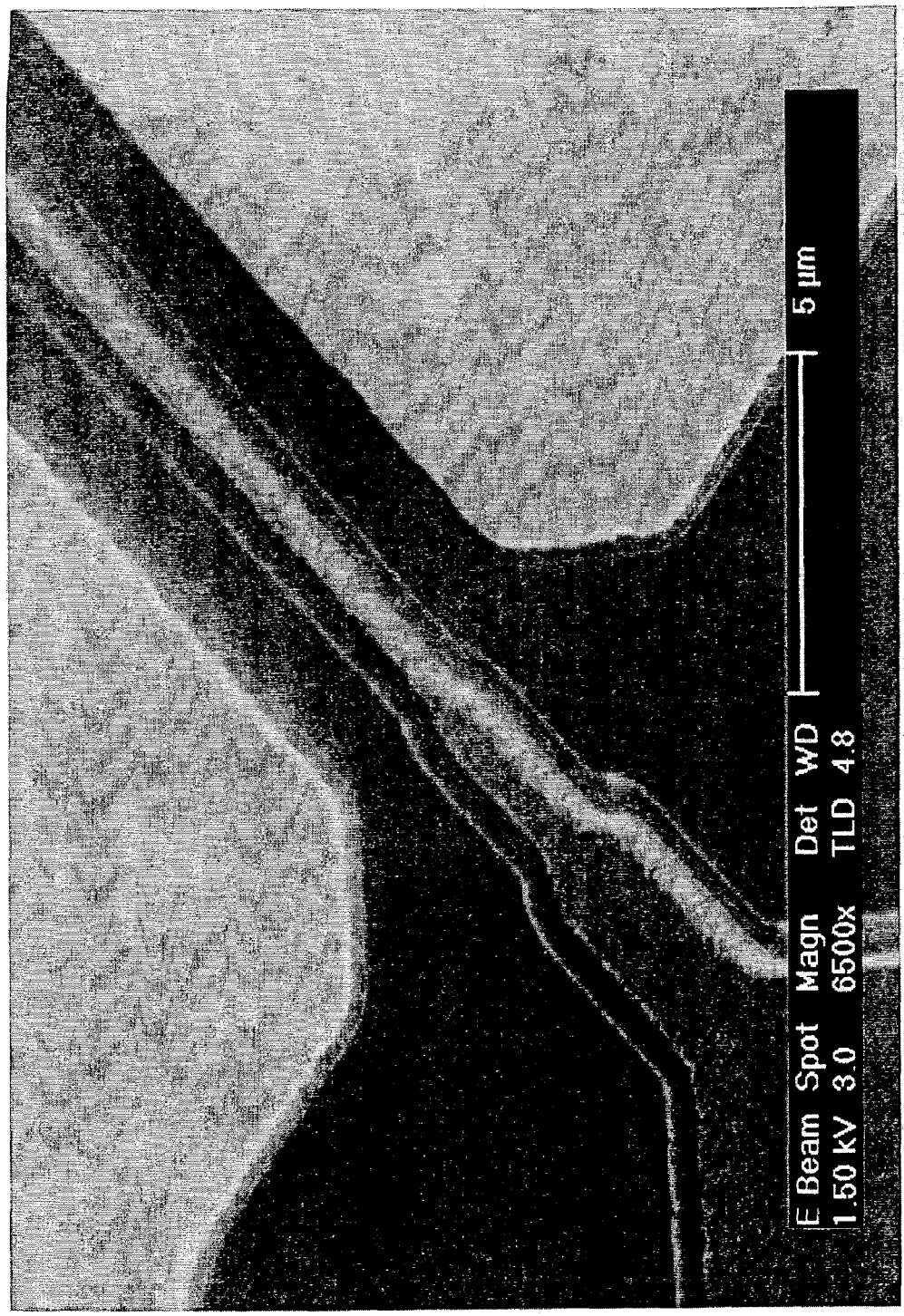
FIG. 9 is a SEM image showing a surface of a GaAs field effect transistor produced by a method according to a third preferred embodiment of the present invention.

FIG. 9 is a SEM image showing the surface of the GaAs field effect transistor 100 produced by the asherless process. Similar to FIG. 2, the image shows a gate electrode and source/drain electrodes formed on both sides thereof.

As can be seen from the SEM image, the transistor has an excellent appearance having no residual resist.

Figure 10:
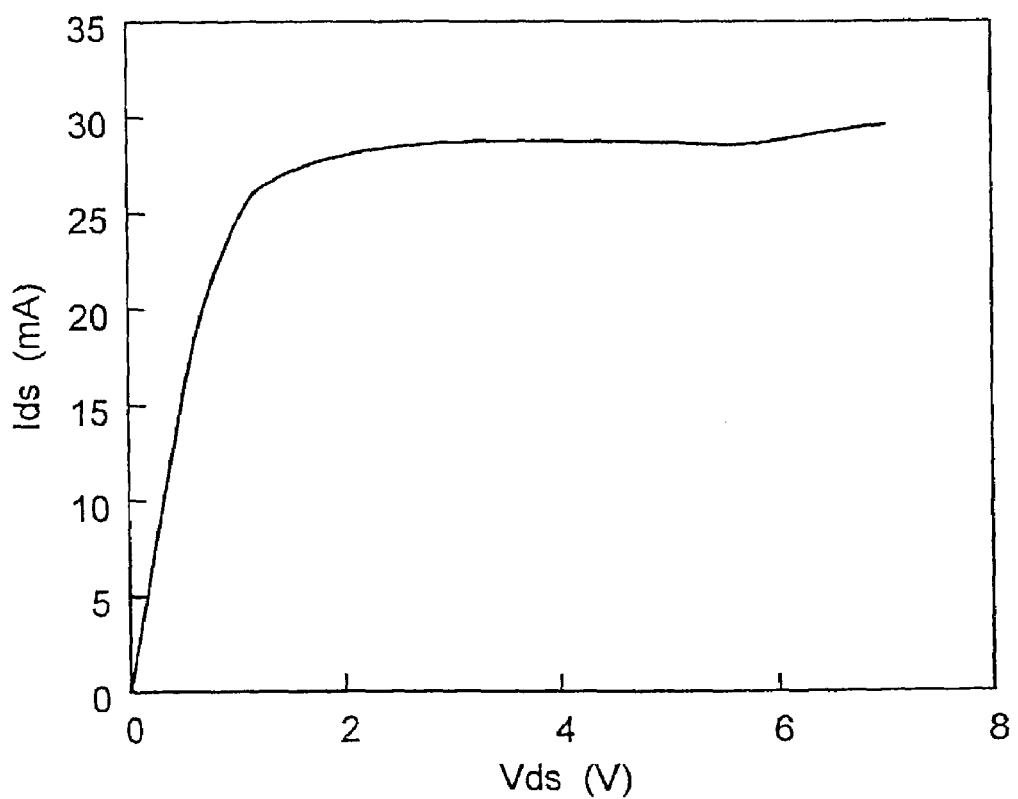
FIG. 10 is a graph showing recess current characteristics of the gateless GaAs field effect transistor produced by the method according to the third preferred embodiment of the present invention.

FIG. 10 is a graph showing the relation between Vds and Ids, i.e. recess current characteristics, after the lift-off process using the resist remover of this embodiment, under the condition of no gate electrode. As can be seen from FIG. 10, characteristics substantially identical with the recess current characteristics before the lift-off process shown in FIG. 5A are obtained.

As described above, for the producing method of this embodiment, the use of the resist remover consisting of dimethyl piperidone and N-methyl-2-pyrrolidone allows removal of a resist mask without leaving any residual resist, and accomplishment of an asherless process. This can prevent deterioration of various characteristics of the device caused in the ashing process, such as gate lag, changes in the gate/drain breakdown voltage, and deterioration of the FET noise. Further, variations in the recess current characteristics caused by the use of an aggressive resist remover can be prevented.

Fourth Preferred Embodiment

The method of producing the GaAs field effect transistor 100 of this embodiment is the same as that of the first preferred embodiment except for the resist remover used in Step 4.

In the producing method of this embodiment, after the resist mask is formed in the Steps 1 through 3, the resist mask is released using a resist remover of a mixture consisting of 3-methyl-2-oxazolidinone (MOZ) and diethyl hydroxylamine.

As for the mixing ratio of the resist remover, the mixture includes about 70 percent to about 90 percent of 3-methyl-2-oxazolidinone by weight and the rest of the mixture consists of diethyl hydroxylamine.

This releasing step is performed by immersing the semi-insulating GaAs substrate 1 having the resist mask formed thereon into the resist remover at a temperature and time of about 85 degree C. and about 30 minutes.

The resist remover used in the producing method of this embodiment allows effective removal of the resist mask and residual resist without causing corrosion or dissolution of GaAs or metals.

This eliminates the need of an ashing process for removing residual resist using oxygen plasma or the like after the removal of the resist mask (asherless process).

After the resist mask is immersed in the resist remover and released, the semi-insulating GaAs substrate 1 is immersed in isopropyl alcohol (IPA) and rinsed therein. Using isopropyl alcohol as the cleaning solution can prevent deterioration of the characteristics of the device caused by another cleaning solution including the resist remover dissolved therein.

In these steps, the GaAs field effect transistor 100 as shown in FIG. 1D is completed.

Figure 11:
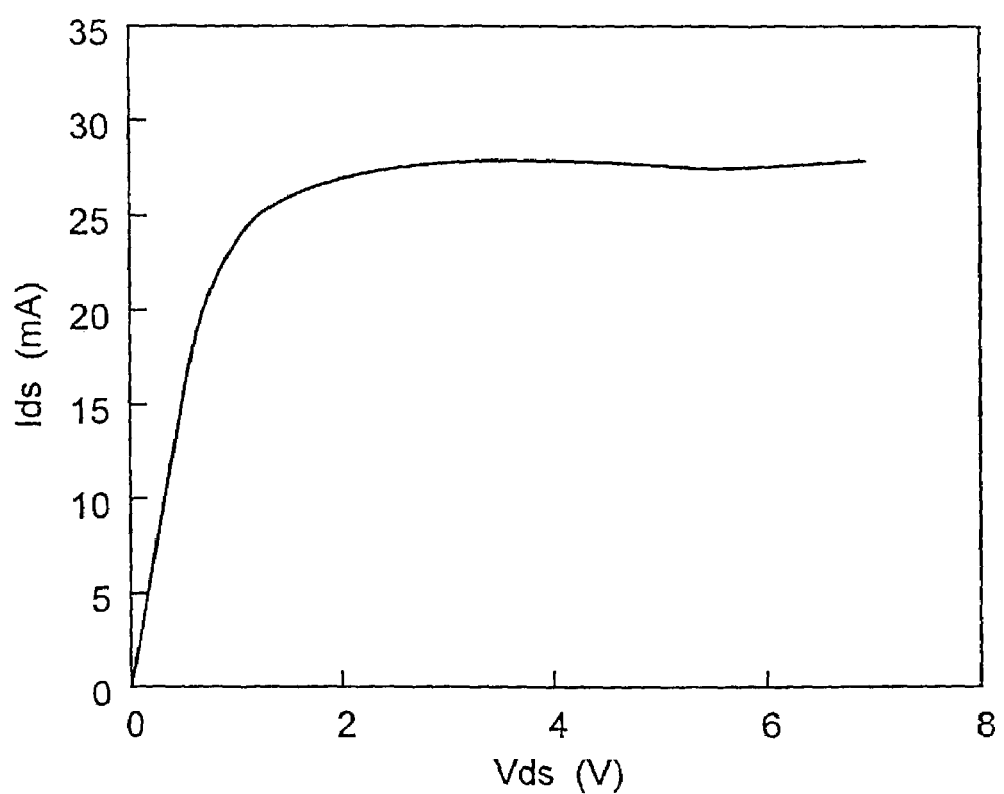
FIG. 11 is a graph showing recess current characteristics of a gateless GaAs field effect transistor produced by a method according to a fourth preferred embodiment of the present invention.

FIG. 11 is a graph showing the relation between Vds and Ids, i.e. recess current characteristics, after the lift-off process using the resist remover of this embodiment, under the condition of no gate electrode. As can be seen from FIG. 11, characteristics substantially identical with the recess current characteristics before the lift-off process shown in FIG. 5A are obtained.

As described above, for the producing method of this embodiment, the use of the resist remover consisting of 3-methyl-2-oxazolidinone and diethyl hydroxylamine allows removal of a resist mask without leaving any residual resist, and accomplishment of an asherless process. This can prevent deterioration of various characteristics of the device caused in the ashing process, such as gate lag, changes in the gate/drain breakdown voltage, and deterioration of the FET noise. Further, deterioration of the recess current characteristics caused by the use of an aggressive resist remover can be prevented.

In the first through fourth preferred embodiments, descriptions are provided of the GaAs field effect transistor 100. However, this producing method can also be used for methods of forming an ohmic electrode of a GaAs field effect transistor such as a HEMT for example, and a base electrode and a collector electrode of an HBT. It can also be used for production of an LED or a solar cell, other than a transistor device.

The resist removers used in the first through fourth preferred embodiments apply to the process where extremely advanced technology is required, such as a process of forming a gate electrode on an active layer.

Of course, these resist removers can also be used for other processes, such as a step of interconnection or a step of electroplating the backside of a substrate. The use of these resist removers can reduce the number of kinds of resist removers required for the entire production process and thus production cost.

Further, this producing method can be used for production of a device made of a compound semiconductor other than GaAs.

As obvious from the above descriptions, the use of the producing method including an asherless process according to this invention can improve the producing yield, without deteriorating the characteristics of a semiconductor device.

Also, the asherless process can simplify the producing process and thereby reduce producing cost.

What is claimed is:

1. A method of producing a compound semiconductor device comprising a lift-off process, the lift-off process comprising:
    forming a resist mask having an electrode opening on an active layer of a compound semiconductor that is on a substrate of a compound semiconductor;
    forming a metal layer on the resist mask and on the active layer in the electrode opening; and
    dissolving the resist mask and removing the metal layer on the resist mask, leaving the metal layer on the active layer in the electrode opening as an electrode, using a resist remover consisting of about 10 wt % to about 50 wt % of 3-methyl-2-oxazolidinone and about 90 wt % to about 50 wt % of N-methyl-2-pyrrolidone.

2. The method according to claim 1, further comprising removing the resist remover by cleaning with isopropyl alcohol.

3. The method according to claim 1, wherein the compound semiconductor is gallium arsenide.

4. The method according to claim 1, further comprising forming a recess in the active layer, before dissolving the resist mask, wherein, in dissolving the resist mask, the metal layer is left on the active layer in the recess as a gate electrode.

5. A method of producing a compound semiconductor device comprising a lift-off process, the lift-off process comprising:
    forming a resist mask having an electrode opening on an active layer of a compound semiconductor that is on a substrate of a compound semiconductor;
    forming a metal layer on the resist mask and on the active layer in the electrode opening; and
    dissolving the resist mask and removing the metal layer on the resist mask, leaving the metal layer on the active layer in the electrode opening as an electrode, using a resist remover consisting of about 10 wt % to about 50 wt % of dimethyl piperidone and about 90 wt % to about 50 wt % of N-methyl-2-pyrrolidone.

6. The method according to claim 5, further comprising removing the resist remover by cleaning with isopropyl alcohol.

7. The method according to claim 5, wherein the compound semiconductor is gallium arsenide.

8. The method according to claim 5, further comprising forming a recess in the active layer, before dissolving the resist mask, wherein, in dissolving the resist mask, the metal layer is left on the active layer in the recess as a gate electrode.

9. A method of producing a compound semiconductor device comprising a lift-off process, the lift-off process comprising:
    forming a resist mask having an electrode opening on an active layer of a compound semiconductor that is on a substrate of a compound semiconductor;
    forming a metal layer on the resist mask and on the active layer in the electrode opening; and
    dissolving the resist mask and removing the metal layer on the resist mask, leaving the metal layer on the active layer in the electrode opening as an electrode, using a resist remover consisting of about 70 wt % to about 95 wt % of 3-methyl-2-oxazolidinone and about 30 wt % to 5 wt % of diethyl hydroxylamine.

10. The method according to claim 9, further comprising removing the resist remover by cleaning with isopropyl alcohol.

11. The method according to claim 9, wherein the compound semiconductor is gallium arsenide.

12. The method according to claim 9, further comprising forming a recess in the active layer, before dissolving the resist mask, wherein, in dissolving the resist mask, the metal layer is left on the active layer in the recess as a gate electrode.

* * * * *